United States Patent
Kratochvíl

(10) Patent No.: US 11,753,254 B2
(45) Date of Patent: Sep. 12, 2023

(54) TRANSPORT APPARATUS AND METHOD FOR TRANSFERRING A SAMPLE BETWEEN TWO DEVICES, AND SYSTEM FOR SAMPLE MANIPULATION

(71) Applicant: FEI Company, Hillsboro, OR (US)

(72) Inventor: Tomas Kratochvíl, Brno (CZ)

(73) Assignee: FEI Company, Hillsboro, OR (US)

( * ) Notice: Subject to any disclaimer, the term of this patent is extended or adjusted under 35 U.S.C. 154(b) by 560 days.

(21) Appl. No.: 16/751,025

(22) Filed: Jan. 23, 2020

(65) Prior Publication Data

US 2020/0270070 A1  Aug. 27, 2020

(30) Foreign Application Priority Data

Feb. 21, 2019  (EP) ..................... 19158552

(51) Int. Cl.
  *B65G 47/68*  (2006.01)
  *H01J 37/18*  (2006.01)
(52) U.S. Cl.
  CPC ............ *B65G 47/68* (2013.01); *H01J 37/185* (2013.01); *H01J 2237/184* (2013.01)
(58) Field of Classification Search
  CPC .. B65G 47/68; H01J 37/185; H01J 2237/184; H01J 2237/18; H01J 37/18; H01J 2237/204; H01J 2237/208; H01L 21/67709; G01N 23/2204; G01N 23/04; G01N 23/2202; G01N 35/04; G01N 2035/0477; G01N 2035/0479
  See application file for complete search history.

(56) References Cited

U.S. PATENT DOCUMENTS

| 5,039,864 | A | 8/1991 | Kondo |
| 7,841,820 | B2 | 11/2010 | Bonora et al. |
| 2003/0129045 | A1* | 7/2003 | Bonora ............ H01L 21/67709 414/217 |
| 2014/0305227 | A1* | 10/2014 | Johns ................. B04B 13/00 73/863.01 |

FOREIGN PATENT DOCUMENTS

| CN | 108528463 | 9/2018 |
| GB | 1317105 | 5/1973 |
| JP | 2973380 | 11/1999 |
| WO | 98/12737 | 3/1998 |
| WO | WO-2019195677 A1 * | 10/2019 ............ B01L 3/502 |

* cited by examiner

*Primary Examiner* — Edward Chin

(57) ABSTRACT

The invention relates to a transport apparatus for transferring a sample between two devices. The transport apparatus comprises a transport tube provided with a carrier for holding a sample. The carrier is movable within said transport tube along a length thereof. The transport apparatus further comprises an actuator tube extending substantially next to said transport tube and which is provided with an actuator element that is movable within said actuator tube. Said actuator element comprises a first magnet part, and said sample carrier is provided with a second magnet part, wherein said first magnet part and said second magnet part are configured such that movement of the sample carrier through said transport tube is linked to movement of the magnetic actuator element through the actuator tube. In this way, movement of the magnetic actuator causes movement of the sample carrier, allowing safe, reliable and protected transport of the sample.

12 Claims, 3 Drawing Sheets

TRANSPORT APPARATUS AND METHOD FOR TRANSFERRING A SAMPLE BETWEEN TWO DEVICES, AND SYSTEM FOR SAMPLE MANIPULATION

BACKGROUND OF THE INVENTION

Transferring a sample between two devices is a common task. Samples are often prepared using a sample preparation device and studied in an analysis device at a distant location from the preparation device. Transfer may take place manually. A user collects the sample at the preparation device and brings it to the analysis device, where it is inserted into said analysis device. The sample may be compromised during transfer between the two devices, which is undesirable.

To obtain a high-quality analysis, it is important that the sample is preserved in its prepared condition as much as possible, and that damaging and/or alteration is prevented as much as possible.

This is certainly important in charged particle microscopy (CPM), where the condition of the sample is critical for obtaining a desired quality. Charged-particle microscopy, such as electron microscopy, is a well-known and increasingly important technique for imaging microscopic objects. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" apparatus (e.g. a FIB-SEM), which additionally employ a "machining" Focused Ion Beam (FIB), allowing supportive activities such as ion-beam milling or Ion-Beam-Induced Deposition (IBID), for example.

A specimen to be viewed in a (S)TEM generally has to be very thin (e.g. with a thickness of the order of a few hundred nm, or less), so as to allow sufficient transmission of electrons therethrough. A thin (flake-like) specimen of this type is conventionally referred to as a lamella, and is generally cut from a larger ("bulk") sample in a dual-beam apparatus such as a FIB-SEM. After preparation, the lamella may be fixed to a lamella support, such as a FIB lift out grid, where it is carefully placed in a required orientation for use in a (S)TEM (or other type of CPM). Transfer of this sample (lamella with lamella support) must be done carefully to ensure that the sample is not damaged.

Preparation and study of biological samples using Cryo-EM adds a further complexity to transfer of samples. In Cryo-EM samples are preserved by rapid freezing using a vitrification technique and observed by cryo-TEM. A cryo-FIB technique may additionally be used for cryo-sectioning the sample. Studying biological samples may thus comprise transfer of the cryo-sample from one device to another.

From the above it follows that a need exists for a transport apparatus for transferring a sample between two devices, in a safe and reliable manner.

SUMMARY OF THE INVENTION

The invention relates to a transport apparatus for transferring a sample between two devices. The invention further relates to a system for sample manipulation comprising such a transport device. The invention also relates to a method of transferring a sample in such a system.

To this end, the invention provides a transport apparatus for transferring a sample between two devices. Said transport apparatus comprises a transport tube provided with a carrier for holding a sample, wherein said carrier is movable within said transport tube along a length thereof. The transport apparatus further comprises an actuator tube extending substantially next to said transport tube, wherein said actuator tube is provided with an actuator element that is movable within said actuator tube. Said actuator element comprises a first magnet part. Said sample carrier is provided with a second magnet part, wherein said first magnet part and said second magnet part are provided in such a way that movement of the sample carrier through said transport tube is linked to movement of the magnetic actuator element through the actuator tube. This way the magnetic actuator element may be moved, and the sample carrier follows the movement of the magnetic actuator element due to the second magnet part being linked to the first magnet part. Transferring the sample is thus reliable. During movement, the sample carrier is shielded by the transport tube against the ambient environment. Damage of the sample is therefore prevented. With this, an improved transferring of samples between two devices is obtained.

Embodiments of the invention and further advantages will be explained below.

In an embodiment, said actuator tube is a pneumatic actuator tube. Use of a pneumatic actuator tube makes the transport apparatus reliable, easy to control, and relatively cheap. Said pneumatic actuator tube may be a pressure tube, that uses a positive pressure to push the actuator element towards the desired end of the actuator tube. Said pneumatic actuator tube may alternatively be a suction tube, for example, that uses a vacuum created in the tube to draw the actuator element towards the desired end of the actuator tube, thereby forcing the sample carrier to move to the desired end of the transport tube—and thus to the desired device. Said pneumatic actuator tube may also be a combination tube, that combines the suction tube and pressure tube as described above into a single actuator tube. This way, a combination of drawing and pushing of the actuator element within the pneumatic actuator tube is possible, leading to improved control of the actuator element and a more reliable transport apparatus.

It is conceivable that the actuator element is controlled by providing a desired flow velocity and/or profile within said actuator tube. For example, the actuator element may be slightly smaller than the inner diameter of the actuator tube, and may be transferred by means of providing a flow within said actuator tube.

In an embodiment, said transport tube is a reduced pressure transport tube, in particular a vacuum transport tube. Thus, the carrier for holding the sample is provided in a vacuum transport tube. This allows vitrified samples, such as the cryo-EM samples, to be safely transported between devices.

In an embodiment, said carrier comprises a substantially cylindrical carrier body that is provided with a receiving space for receiving said sample to be transported. The cylindrical carrier body allows for smooth transport through the transport tube. The receiving space in the carrier body allows for additional protection of the sample during transport, and it allows for improved handling of the sample, for example during loading/unloading of the sample into/from the carrier body.

Said second magnet part may be provided on said carrier body. In particular, said second magnet part may be provided on a front and/or rear part of the carrier body. It is noted here that the terms "front" and "rear" may be used to refer to a direction of movement, wherein a front part faces the direction of travel, and the rear part faces away from the direction of travel. The terms "front" and "rear" are not to be construed in a limited way, as they are primarily used here to easily distinguish between the two outer ends of the carrier body.

In an embodiment, said second magnet part comprises a front magnet assembly that is provided on a front-end face of the substantially cylindrical carrier body.

In an embodiment, said second magnet part comprises a rear magnet assembly that is provided on a rear-end face of the substantially cylindrical carrier body.

Said front magnet assembly and said rear magnet assembly may be provided in such a way that similar poles are directed towards the sample. The front magnet assembly has a north pole and a south pole, and said rear magnet assembly has a north pole and a south pole as well. In this embodiment, the north pole of the front magnet assembly is facing the carrier body, and the north pole of the rear magnet assembly is facing the carrier body as well. Alternatively, the south pole of the front magnet assembly and the south pole of the rear magnet assembly may be facing the carrier body. The above feature may be used to reduce the magnetic field in the sample area.

In an embodiment, said front and/or rear magnet assembly each comprise a first magnetic element and a second magnetic element. The second magnetic element is provided in between said first magnetic element and said carrier body. Opposing poles of said first magnetic element and said second magnetic element are directed towards each other. In other words, the first magnetic element and the second magnetic element are provided in such a way that the first magnetic element attracts the second magnetic element. The above features may be used to reduce the magnetic field in the sample area.

According to an aspect, a system for sample manipulation is provided, comprising a first device arranged for manipulating a sample, a second device arranged for manipulating a sample, a transport apparatus as described above and connected to said first device and to said second device. Said first device may be a sample preparation device, and said second device may be a sample study device or analysis device. Said first device and/or said second device may comprise a charged particle microscope, as described in the introductory part of this document. For example, the first device may be a focused ion beam device, and/or the second device may be an electron microscope.

With the system for sample manipulation as described herein, safe and reliable sample transfer between different devices is possible. Transport of the sample through the transport tube ensures that a certain amount of protection for the sample is obtained. Additionally, the user does not need to contact the sample during transport. Loading and unloading of the sample into the sample carrier may be done in a safe and reliable manner. The first device and/or the second device may be provided with a loading device and/or unloading device, such that the sample can be easily positioned in the transport apparatus, for example in the receiving space of the carrier body, in an embodiment.

According to an aspect, a method is provided for transferring a sample in a system, such as the system described above. The method according to this aspect comprises the steps of providing a system for sample manipulation as described above, providing a sample in the first device, transferring said sample to the carrier body, moving the actuator element in the actuator tube for moving the carrier body that is magnetically linked to said actuator element, thereby moving said sample from said first device to said second device, and transferring the sample from the carrier body to the second device.

Thus, in the method, the magnetic actuator element may be moved, and the sample carrier follows the movement of the magnetic actuator element due to the second magnet part being linked to the first magnet part. As explained earlier, this improves the reliability of transferring the sample, but it also increases the safety of the sample, as the sample carrier is shielded by the transport tube during transport. Damage of the sample is therefore prevented. With this, an improved method of transferring samples between two devices is obtained.

BRIEF DESCRIPTION OF THE DRAWINGS

The detailed description is described with reference to the accompanying figures. In the figures, the left-most digit(s) of a reference number identify the figure in which the reference number first appears. The same reference numbers in different figures indicates similar or identical items.

Figure 1:
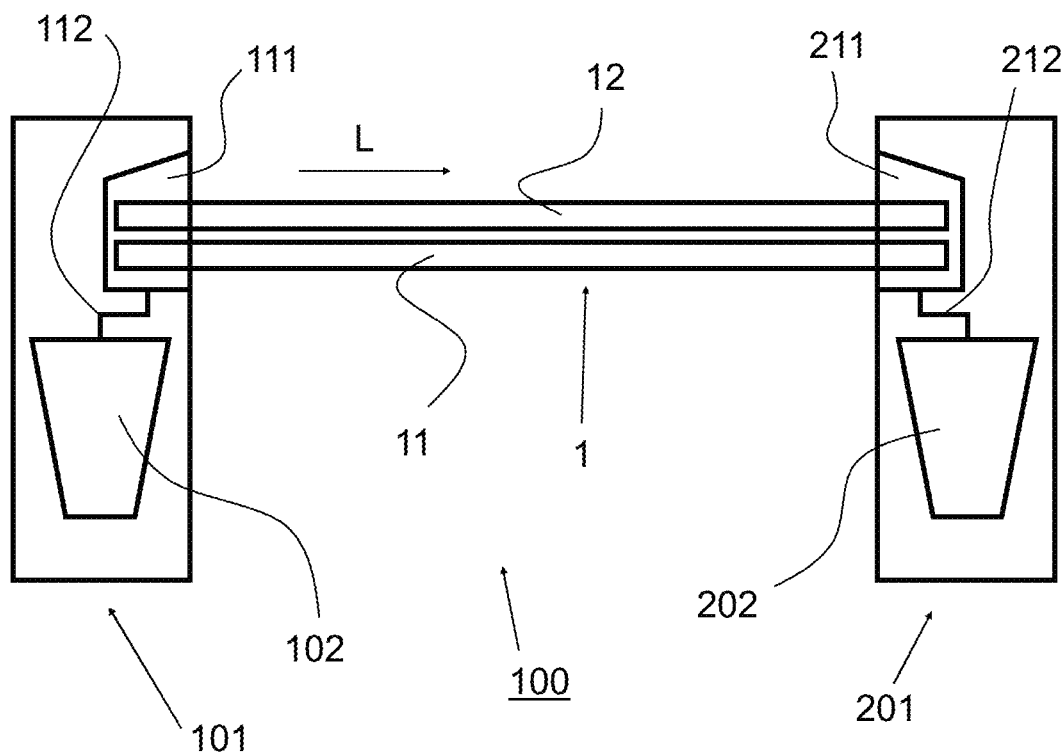
FIG. 1 is a schematic overview of a system for sample manipulation, comprising a transfer apparatus as disclosed herein.

Like reference numerals refer to corresponding parts throughout the several views of the drawings. Generally, in the figures, elements that are likely to be included in a given example are illustrated in solid lines, while elements that are optional to a given example are illustrated in broken lines. However, elements that are illustrated in solid lines are not essential to all examples of the present disclosure, and an element shown in solid lines may be omitted from a particular example without departing from the scope of the present disclosure.

DETAILED DESCRIPTION OF EMBODIMENTS

FIG. 1 shows a schematic overview of a system 100 for sample manipulation. The system 100 comprises a first device 101 arranged for manipulating a sample, and a second device 201 arranged for manipulating said sample. The first device 101 may for example be a sample preparation device, having a sample preparation room 102. The second device 201 may be a sample analysis device, having a sample analysis room 202. The first device may be a charged particle microscope, in particular a focused ion beam device for preparing a sample. Such a device is known per se to those skilled in the art. The second device may be a charged particle microscope as well, in particular an electron microscope such as a (S)TEM. Said second device 201 is positioned at a distance from said first device 101. The first 101 and the second 201 device are connected to each other by means of a transport apparatus 1 as described herein.

The transport apparatus 1 as shown in FIG. 1 comprises a transport tube 11 connected to said first device 101 and said second device 201. The transport apparatus 1 also comprises an actuator tube 12 connected to said first device 101 and said second device 201. Connection to the devices 101, 201 is established by means of connection parts 111, 211. These connection parts 111, 211 in turn are connected to sample manipulation rooms 102, 202, respectively, such that the sample can be transferred (via lines 112, 212, respectively) from the sample manipulation room 102 of the first device 101, via the transfer apparatus 1, to the sample manipulation room 202 of the second device 201. Details of the connection parts 111, 211 will be described later with respect to FIGS. 5 and 6.

In general, and as an example, the system shown in FIG. 1 allows a sample to be attached to a TEM sample holder in the preparation room 102 and thinned using the focused ion beam (FIB) device 101. The sample can then be transported, using the transport apparatus 1, to the TEM or STEM device 201 where it can be imaged with an electron beam that is part of said device 201. This process of preparing the sample using a FIB, and imaging the sample using (S)TEM is known to those skilled in the art and will not be explained further for reasons of conciseness. However, the transport apparatus as disclosed herein improves the preparation and imaging process, as the sample is protected against ambient environment during transport between the FIB and (S)TEM device, and sample conditions can more easily be maintained, as will be explained next.

Figure 2:
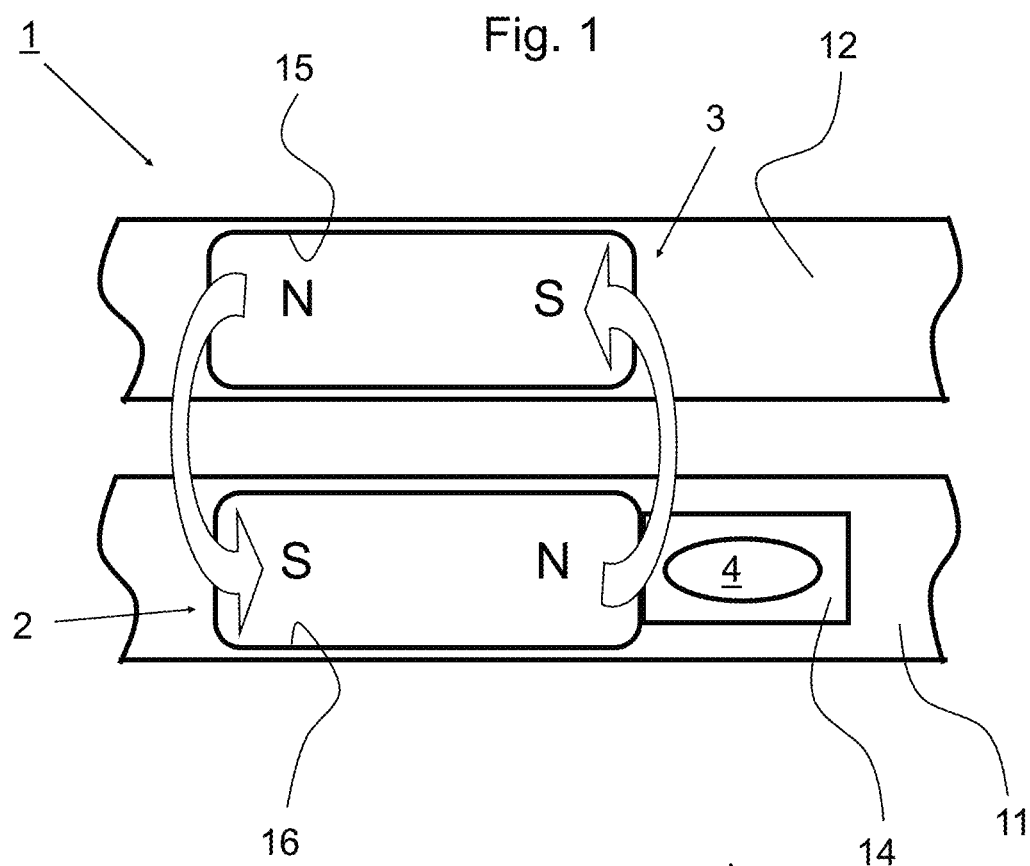
FIG. 2 is a schematic overview of a part of the transfer apparatus as disclosed herein, according to an embodiment thereof.

Now referring to FIG. 2, a detail of the transport apparatus 1 is schematically shown. Here it can be seen that in the transport tube 11, a carrier 2 with a carrier body 14 for holding a sample 4 is provided. The carrier 2 is movable within said transport tube 11 along a length L thereof. The actuator tube 12 extends substantially next to said transport tube 11. An actuator element 3 is provided within said actuator tube 12, and is movable within said actuator tube 12. In the embodiment shown, the actuator element 3 comprises a first magnet part 15, and said sample carrier is provided with a second magnet part 16. The magnet parts 15, 16 are provided in such a way that movement of the sample carrier 2 through said transport tube 11 is linked to movement of the magnetic actuator element 3 through the actuator tube 12. The poles N, S of the magnet parts 15, 16 are arranged such that magnetic coupling between the actuator element 3 and the carrier element 2 occurs. In other words, when the actuator element 3 is moved through the actuator tube 12, it magnetically forces the sample carrier 2 through the transport tube 11 as well, enabling a transfer of the sample 4 from the first device 101 to the second device 102, in a controllable, safe and reliable manner.

In FIGS. 1 and 2, the transport tube 11 and the actuator tube 12 are shown as rigid tubes, but the use of flexible tubes is possible as well and provides for easy connection between several devices.

It is noted that the actuator tube 12 may in an embodiment be a pneumatic actuator tube. The tube 12 may make use of relative differences in pressure to move the actuator element. This may comprise the use of a vacuum, and/or of a positive pressure, to draw and/or push the actuator element 3 through the actuator tube 12, and with this the sample carrier 2 through the transport tube 11.

Figure 3:
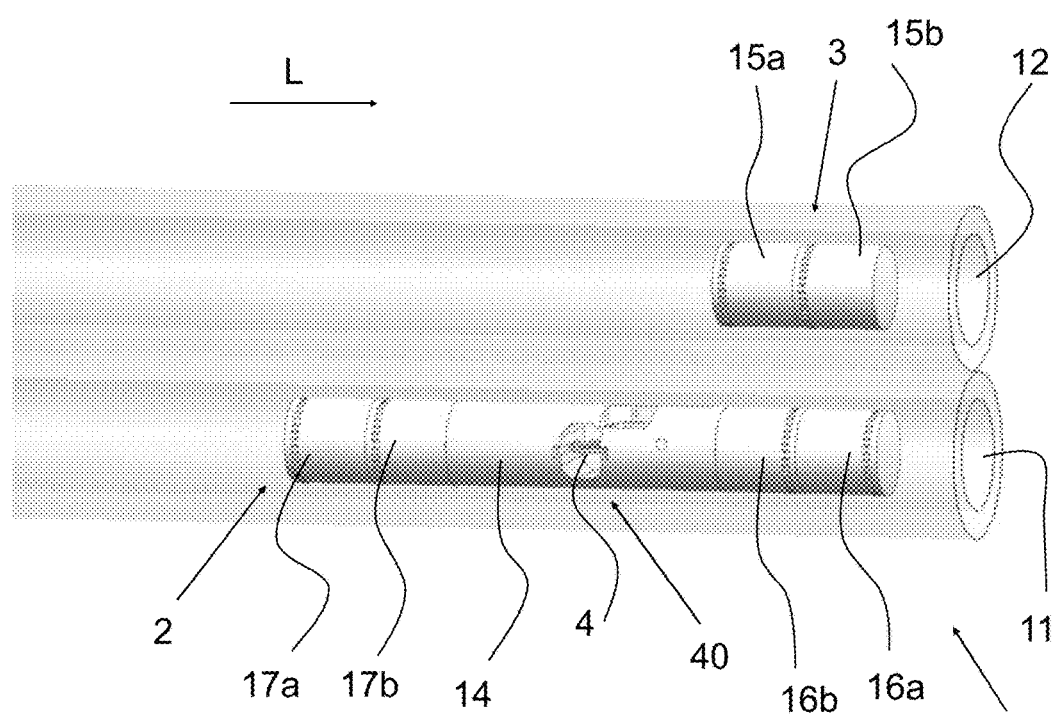
FIG. 3 is a schematic overview of a further embodiment of the transfer apparatus as disclosed herein.

Now referring to FIG. 3, a further embodiment of (a part of) the transport apparatus 1 is shown. Here it can be seen that the sample carrier 2 comprises a substantially cylindrical carrier body 14 that is provided with a receiving space 40 for receiving said sample 4 to be transported. The magnet part 16, 17 provided on the sample carrier (referred to as second magnet part 16) comprises a front magnet assembly 16 that is provided on a front end face of the substantially cylindrical carrier body, as well as a rear magnet assembly 17 that is provided on a rear end face of the substantially cylindrical carrier body 14. Said front and rear magnet assembly 16, 17 each comprise a first magnetic element 16a; 17a and a second magnetic element 16b; 17b. The second magnetic element is provided in between said first magnetic element and said carrier body. Opposing poles of said first magnetic element and said second magnetic element are directed towards each other. As schematically indicated in FIG. 3, each magnetic element has a north pole (indicated by circumferential marks) and a south pole. The first magnetic element 16a of the front magnet assembly 16 has the north pole facing outwards, and the north pole of the second magnetic element 16b is directed to south pole of the first magnetic element 16a. The rear magnet assembly 17 has a similar construction, wherein the north pole is facing outwards too. Thus in effect the magnet poles of the front magnet assembly 16 and the rear magnet assembly 17 are oriented in opposite directions, and this reduces the magnetic field on the sample 4. The actuator element 3 comprises a total of two magnet elements 15a-15b in this embodiment, but in principle the actuator is able to function with any other number of magnet elements as well, such as, for example, one, three, four or more.

Figure 4:
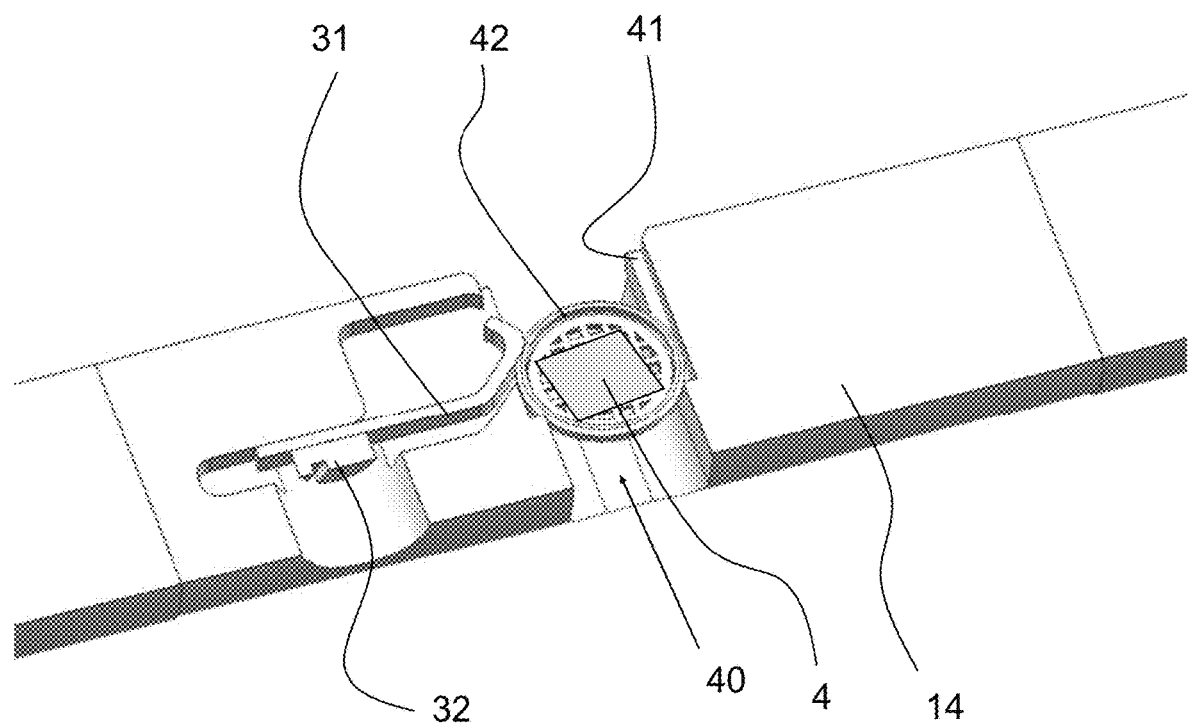
FIG. 4 is a cross-section of a part of the sample carrier used in the transfer apparatus as shown in FIG. 3.

As can be seen in FIG. 3 and FIG. 4, the receiving space 40 comprises a groove 41. This enables the sample 4 (provided on a sample holder 42, as schematically shown in FIG. 4) to be easily and reproducibly loaded from the (first) device 101 onto the carrier element 2, and unloaded from the carrier element 2 to the (second) device 201. A spring element 31 is provided, attached to the carrier body with a fastening element 32, such as a screw, to lock the sample 4 (i.e. sample holder 42) in the groove, which secures the sample 4 (i.e. sample holder 42) during transport through the transport tube. The sample carrier shown in FIG. 4 is a so called EM grid that is adapted to hold a lamella created by a FIB. It is conceivable of course that other grids for holding a lamella, or other kind of sample 4, are used, such as, for example, a halfmoon grid. Apart from lamellae, the transport apparatus is also suitable to transfer other types of samples.

Figure 5:
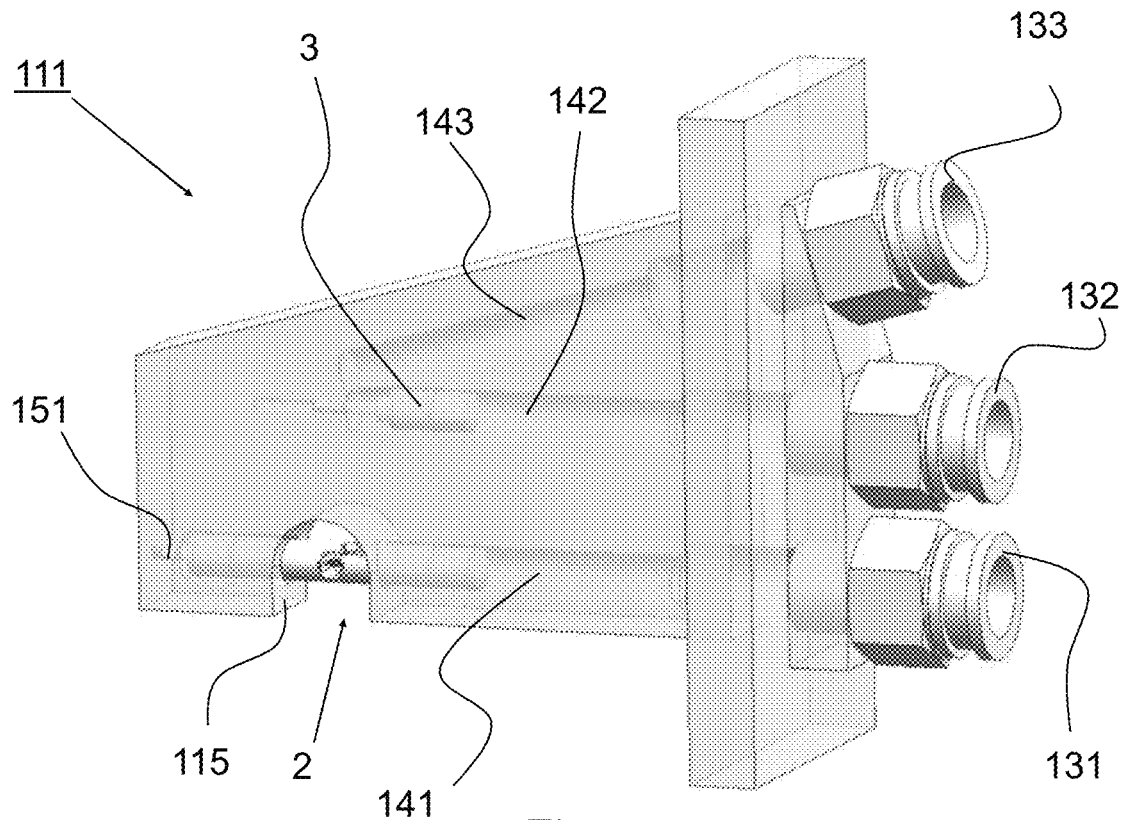
FIG. 5 is a perspective view of a connection part for connecting the transfer apparatus to a device for manipulating the sample.
Figure 6:
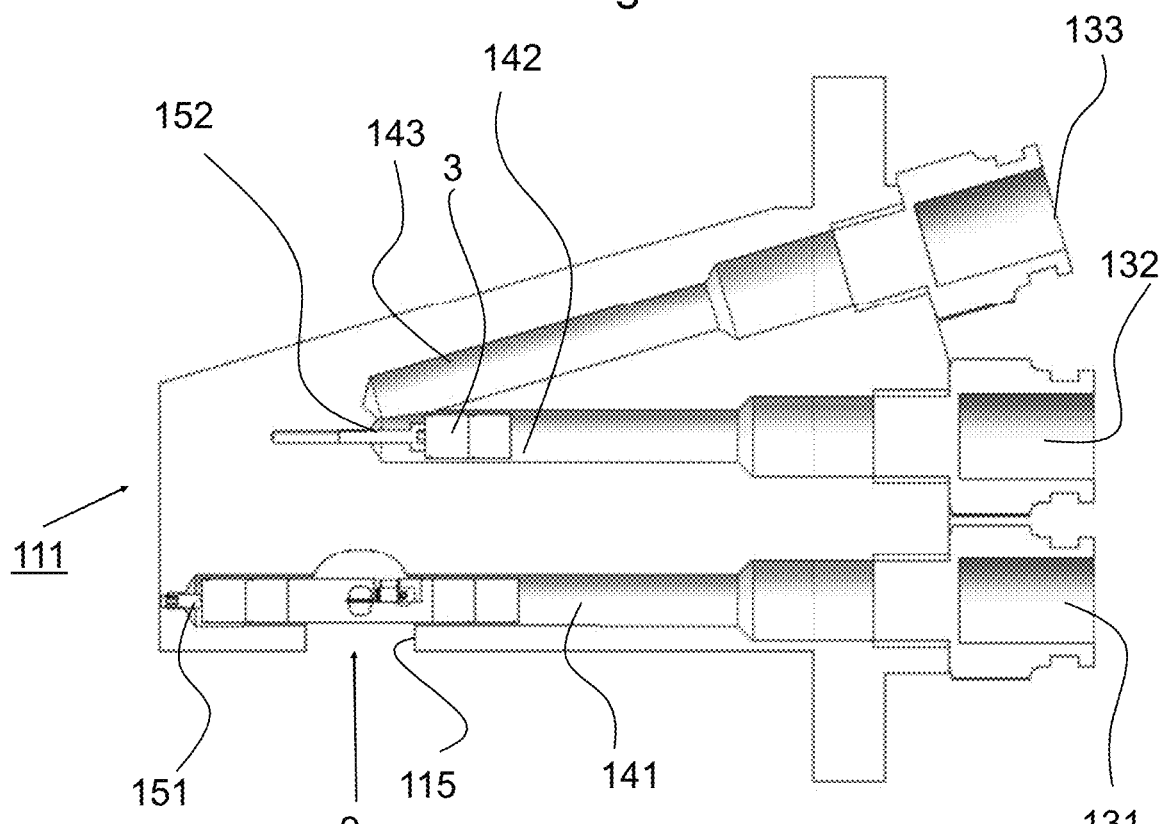
FIG. 6 is a cross-sectional view of the connection part of FIG. 5.

FIGS. 5 and 6 show a connection part 111, in a perspective view, and cross-sectional view, respectively. The connection part 111 acts as an end-point station of the transport apparatus 1, and allows loading/unloading of the sample 4 in the respective device 101, 102 to take place. The connection part 111 comprises a transport connection 131 and an actuator connection 132, to which the transport tube (11, not shown) and the actuator tube (12, not shown) are connectable. These transport connection 131 and actuator connection 132 extend into transport bore 141 and actuator bore 142, respectively. The sample carrier 2 and the actuator 3 are able to travel into the bores 141, 142, respectively, where they will contact a respective stop 151, 152. The stop 151, 152 may be adjustable to accurately determine the end-position of the sample carrier 2 and the actuator 3. In particular, the position of the sample carrier 2 is such that the sample is in line with a recess 115 provided in the connection part 111, so that the sample can be loaded/unloaded from the respective device 101, 201. This way, the connection part 111; 112 provides an interface between the transport apparatus 1 and the respective devices 101; 102. The connection part 111, 112 provides accurate positioning of the actuator element 3 and the carrier element 2 (with sample 4, not shown) at the end position so that loading/unloading may take place, and a further or subsequent transport step may take place. A guide (not shown) may be provided to guide the rotational position of the carrier element 2 (with sample 4) to the desired position, such that take-out and/or placement of the sample into the carrier element 2 is possible.

The connection part has, in the embodiment shown, a further connection 133, that is in fluid contact with the actuator connection, to enable pneumatic action of the actuator element 3.

The connection part 111 with the transport bore 141 and transport connection 131 allow the transport tube to be a closed system. Thus, the transport tube 11 may be a reduced pressure transport tube 11, in particular a vacuum transport tube. This allows, for example, a cryo-sample 4 to be transferred in a safe and reliable manner between first and second devices, in particular charged particle microscopes.

Above, the invention has been elucidated by means of several embodiments. The desired protection is determined by the appended claims.

What is claimed is:

1. A transport apparatus for transferring a sample between two devices, said transport apparatus comprising:
   a transport tube provided with a carrier for holding a sample, wherein said carrier is movable within said transport tube along a length thereof; and
   an actuator tube extending substantially next to said transport tube, wherein said actuator tube is provided with a magnetic actuator element that is movable within said actuator tube, and wherein the magnetic actuator element is separate from and located outside of the transport tube;
   wherein said magnetic actuator element comprises a first magnet part, and said sample carrier is provided with a second magnet part, wherein said first magnet part and said second magnet part are provided in such a way that movement of the sample carrier through said transport tube is linked to movement of the magnetic actuator element through the actuator tube.

2. A transport apparatus according to claim 1, wherein said actuator tube is a pneumatic actuator tube.

3. A transport apparatus according to claim 1, wherein said transport tube is a reduced pressure transport tube, in particular a vacuum transport tube.

4. A transport apparatus according to claim 1, wherein said carrier comprises a substantially cylindrical carrier body that is provided with a receiving space for receiving said sample to be transported.

5. A transport apparatus according to claim 4, wherein said second magnet part comprises:
   a front magnet assembly that is provided on a front end face of the substantially cylindrical carrier body; and/or
   a rear magnet assembly that is provided on a rear end face of the substantially cylindrical carrier body.

6. A transport apparatus according to claim 5, wherein said front and/or rear magnet assembly comprises a first magnetic element and a second magnetic element provided in between said first magnetic element and said carrier body, wherein opposing poles of said first magnetic element and said second magnetic element are directed towards each other.

7. A system for sample manipulation, comprising:
   a first device arranged for manipulating a sample;
   a second device arranged for manipulating a sample; and
   a transport apparatus, the transport apparatus comprising:
   a transport tube provided with a carrier for holding a sample, wherein said carrier is movable within said transport tube along a length thereof; and
   an actuator tube extending substantially next to said transport tube, wherein said actuator tube is provided with a magnetic actuator element that is movable within said actuator tube, and wherein the magnetic actuator element is separate from and located outside of the transport tube;
   wherein said magnetic actuator element comprises a first magnet part, and said sample carrier is provided with a second magnet part, wherein said first magnet part and said second magnet part are provided in such a way that movement of the sample carrier through said transport tube is linked to movement of the magnetic actuator element through the actuator tube.

8. A system according to claim 7, wherein said first device is a sample preparation device, and wherein said second device is a sample study device.

9. A system according to claim 7, wherein said first device and/or said second device comprises a charged particle microscope.

10. A system according to claim 9, wherein said first device is a focused ion beam device, and/or said second device is an electron microscope.

11. A method for transferring a sample in a system, comprising the steps of:
    providing a system that comprises a first device arranged for manipulating a sample, a second device arranged for manipulating a sample, and a transport apparatus that is connected to said first device and to said second device, the transport apparatus comprising:
    a transport tube provided with a carrier for holding a sample, wherein said carrier is movable within said transport tube along a length thereof; and
    an actuator tube extending substantially next to said transport tube, wherein said actuator tube is provided with a magnetic actuator element that is movable within said actuator tube, and wherein the magnetic actuator element is separate from and located outside of the transport tube;
    wherein said magnetic actuator element comprises a first magnet part, and said sample carrier is provided with a second magnet part, wherein said first magnet part and said second magnet part are provided in such a way that movement of the sample carrier through said transport tube is linked to movement of the magnetic actuator element through the actuator tube;
    providing a sample in the first device;
    transferring said sample to the carrier body;
    moving the magnetic actuator element in the actuator tube for moving the carrier body that is magnetically linked to said magnetic actuator element, thereby moving said sample from said first device to said second device; and
    transferring the sample from the carrier body to the second device.

12. A transport apparatus according to claim 1, wherein the magnetic actuator element is enclosed within the actuator tube.

* * * * *